United States Patent [19]
Hashimoto et al.

[11] Patent Number: 4,862,170
[45] Date of Patent: Aug. 29, 1989

[54] DIGITAL-ANALOG CONVERTER

[75] Inventors: Youichi Hashimoto, Wako; Takashi Tokuyama; Kazuya Nishiga, both of Iwaki; Yoshihiro Arai, Funabashi; Nobuhide Ueki, Iwaki; Naoki Adachi, Iwaki, all of Japan

[73] Assignees: Ryoichi Mori; Kazuo Toraichi, both of Tokyo, Japan

[21] Appl. No.: 171,812

[22] Filed: Mar. 22, 1988

[30] Foreign Application Priority Data

Mar. 31, 1987 [JP] Japan ................................ 62-078878

[51] Int. Cl.$^4$ ............................................. H03M 1/66
[52] U.S. Cl. ...................................... 341/144; 341/126
[58] Field of Search ........................ 341/126, 144, 154

[56] References Cited
U.S. PATENT DOCUMENTS 4,156,916 5/1979 Poppelbaum ....................... 341/144
4,233,591 11/1980 Murata et al. ....................... 341/145
4,238,831 12/1980 Pulyer .................................. 341/144
4,614,934 9/1986 Kobayashi et al. ................. 341/144
4,746,903 5/1988 Czarniak et al. .................... 341/144

Primary Examiner—William M. Shoop, Jr.
Assistant Examiner—Marc S. Hoff
Attorney, Agent, or Firm—Staas & Halsey

[57] ABSTRACT

A digital analog converter which is especially suitable for use in converting a digital audio signal into an analog audio signal includes a unit pulse response signal generator for successively generating unit pulse response signals at a predetermined time interval, a digital data generator for generating digital data at the predetermined time interval, a multiplier for multiplying a unit pulse response signal generated at a certain time by a predetermined item of the digital data, and a mixer for producing an analog signal output by combining the unit pulse response signals that have been multiplied by the digital data.

7 Claims, 19 Drawing Sheets

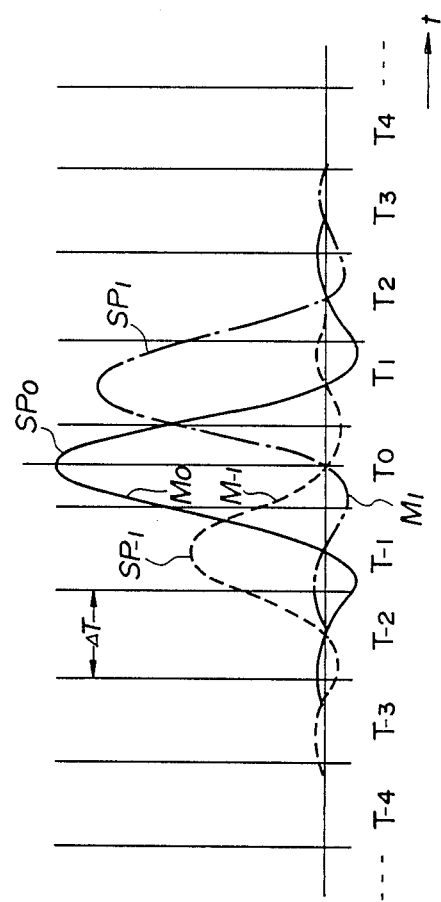

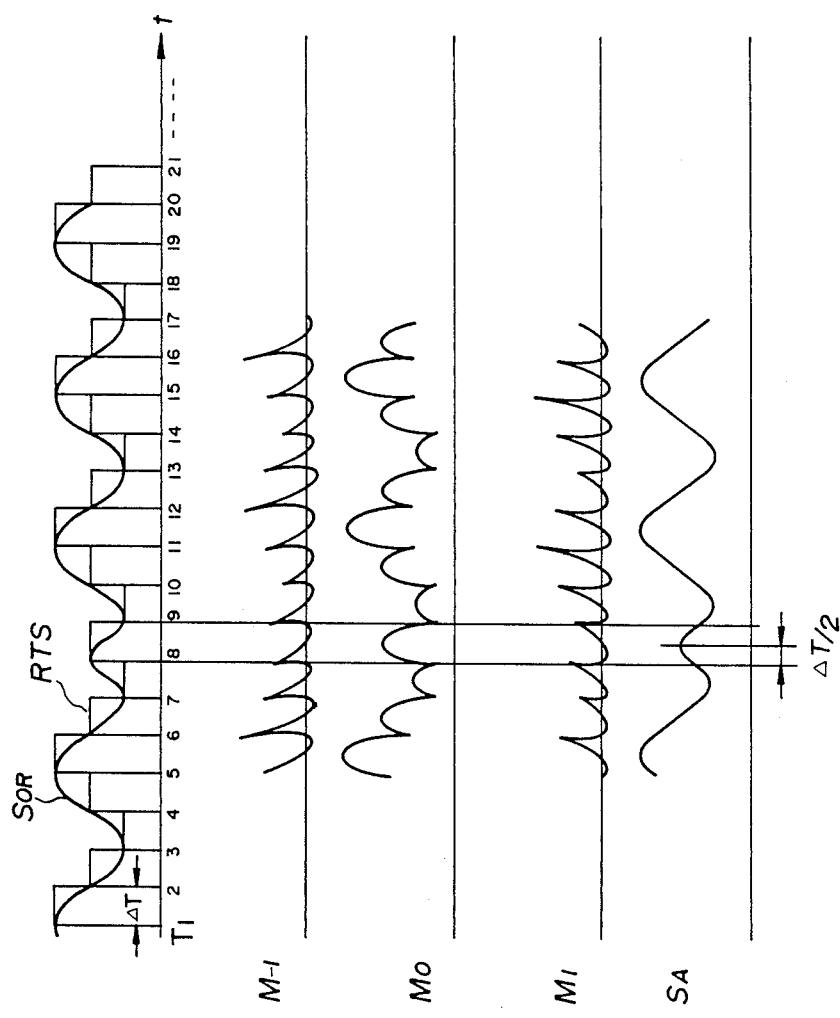

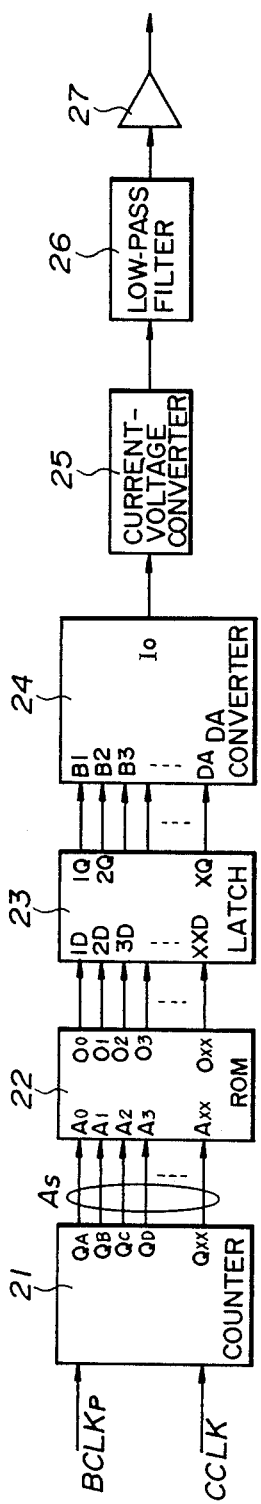
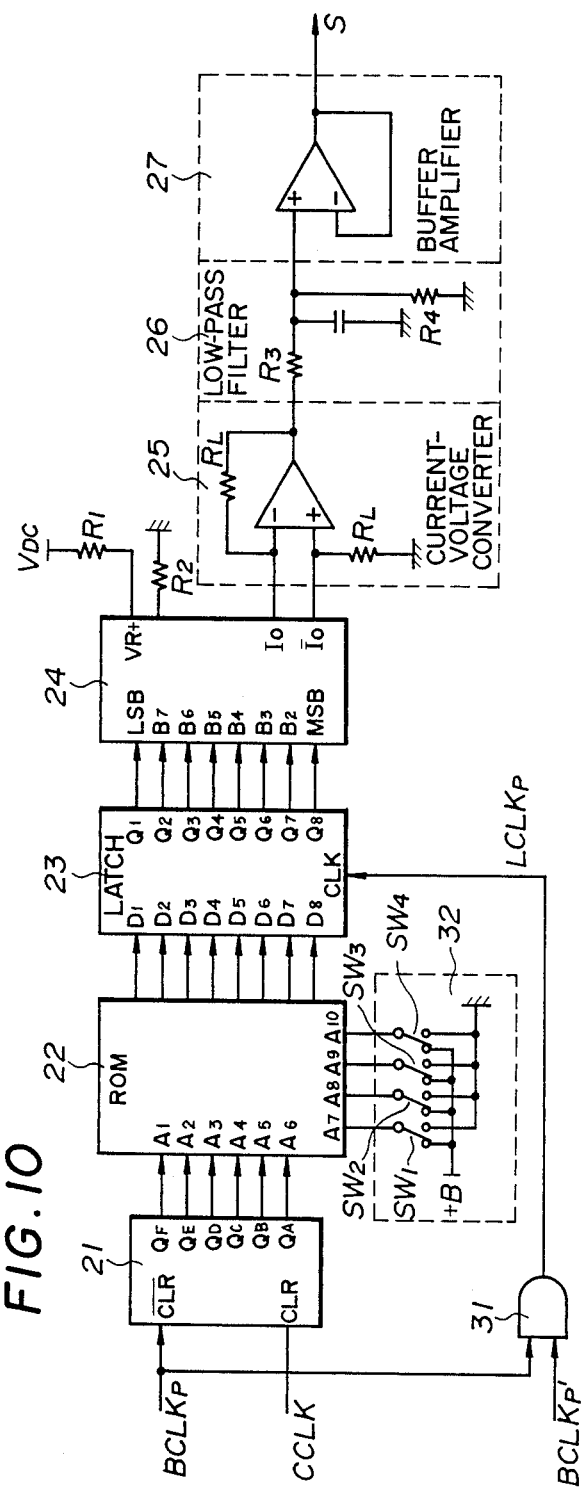
FIG. 9
FIG. 10

| | |
|---|---|
| $S_{-4}(t) =$ | $-0.00296 + 0.0833t - 0.0049t^2$ |
| $S_{-3}(t) =$ | $0.0172 - 0.0488t + 0.0286t^2$ |
| $S_{-2}(t) =$ | $-0.101 + 0.284t - 0.166t^2$ |
| $S_{-1}(t) =$ | $0.585 - 1.66t + 0.971t^2$ |
| $S_0(t) =$ | $0.585 + 1.66t - 1.66t^2$ |
| $S_1(t) =$ | $-0.101 - 0.284t + 0.971t^2$ |
| $S_2(t) =$ | $0.0172 + 0.0488t - 0.166t^2$ |
| $S_3(t) =$ | $-0.00296 - 0.00833t + 0.0286t^2$ |
| $S_4(t) =$ | $0.000508 + 0.00144t - 0.0049t^2$ |

| | |
|---|---|
| $S_{-4}\ ROM(t) =$ | $43200\ S_{-4}(t)$ |
| $S_{-3}\ ROM(t) =$ | $7350\ S_{-3}(t)$ |
| $S_{-2}\ ROM(t) =$ | $1280\ S_{-2}(t)$ |
| $S_{-1}\ ROM(t) =$ | $218\ S_{-1}(t)$ |
| $S_0\ ROM(t) =$ | $127\ S_0(t)$ |
| $S_1\ ROM(t) =$ | $218\ S_1(t)$ |
| $S_2\ ROM(t) =$ | $1280\ S_2(t)$ |
| $S_3\ ROM(t) =$ | $7350\ S_3(t)$ |
| $S_4\ ROM(t) =$ | $43200\ S_4(t)$ |

|  | S-4ROM | S-3ROM | S-2ROM | S-1ROM | S0ROM | S1ROM | S2ROM | S3ROM | S4ROM |
|---|---|---|---|---|---|---|---|---|---|
| $R_5/Z_k$ | 2.940 | 17.28 | 99.22 | 582.6 | 1000 | 582.6 | 99.22 | 17.28 | 2.940 |

|  | R±43 | R±33 | R±23 | R±13 | R03 |
|---|---|---|---|---|---|
| AvK | 2940mV | 17.28mV | 99.22mV | 582.6mV | 1000mV |

FIG. 24
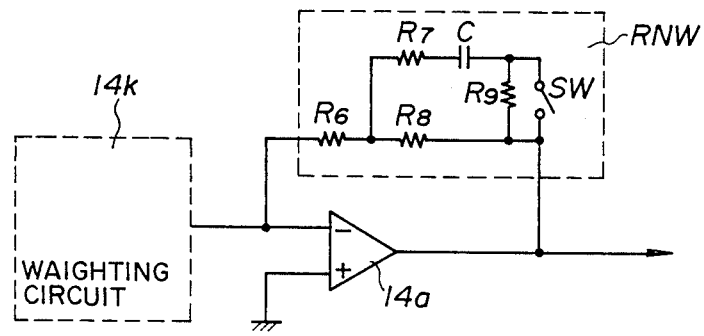
FIG. 25
| UNIT PULSE RESPONSE SIGNAL GENERATOR | | | SHIFT REGISTER | LATCH CIRCUIT |
|---|---|---|---|---|
| BCLKp | CCLK | LCLKp | BCLK | LCLK |
| ⎍⎍⎍⎍⎍ a·fs | ⎍ ⎍ ←1/fs→ | a·ts ⎤ 2a·fs⎦ ⟶ | ⎍⎍⎍⎍⎍ b·fs | ⎍ ←1/fs→ |
FIG. 26
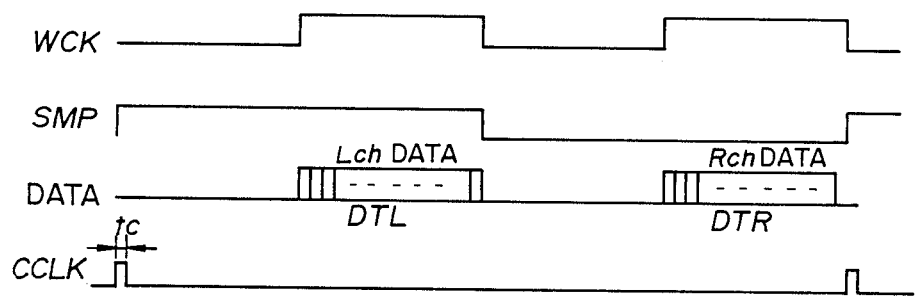

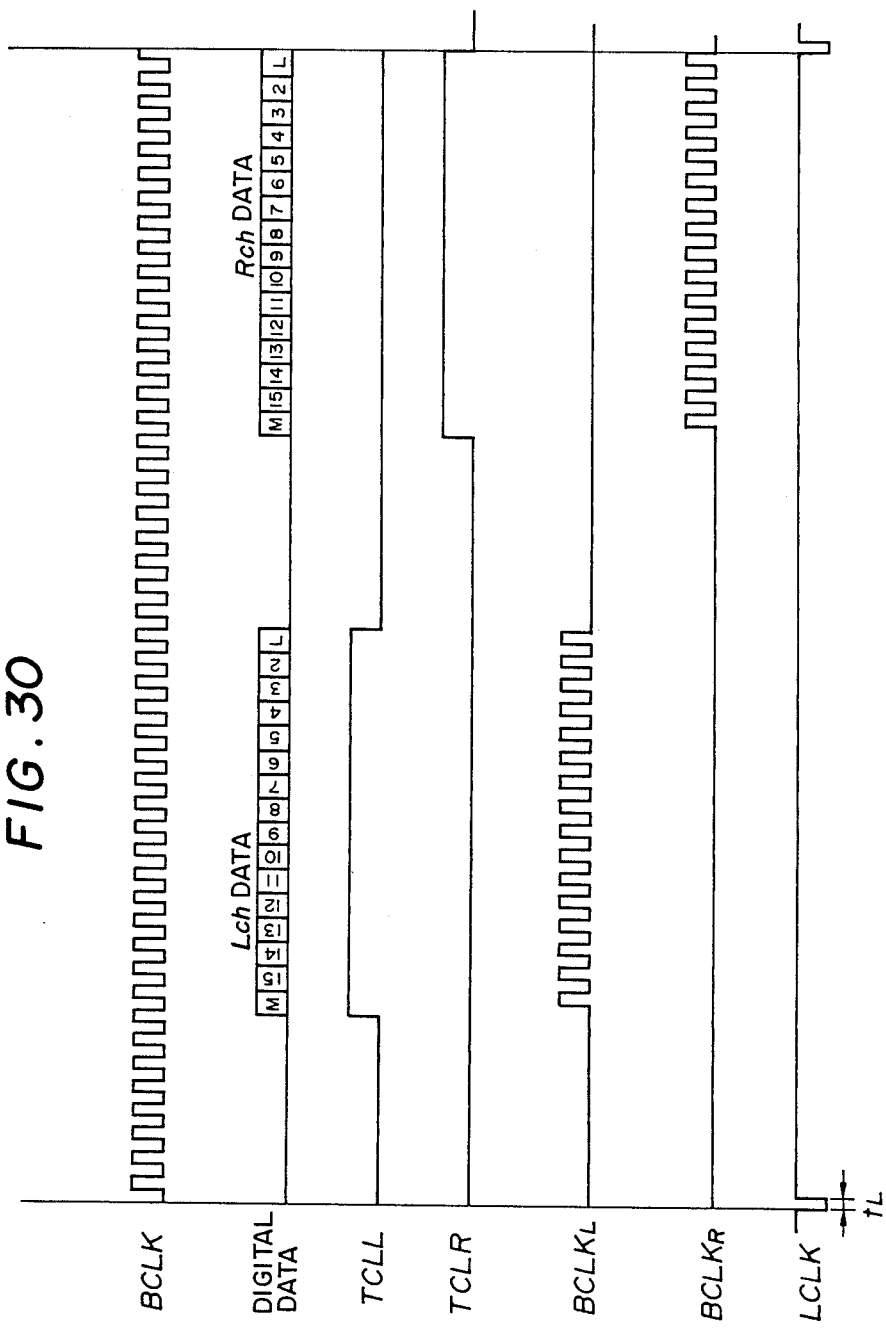

FIG. 36
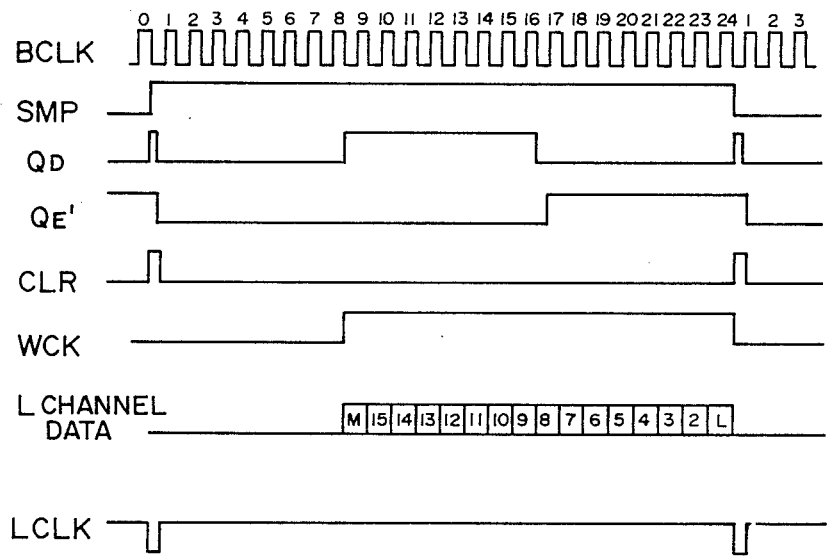
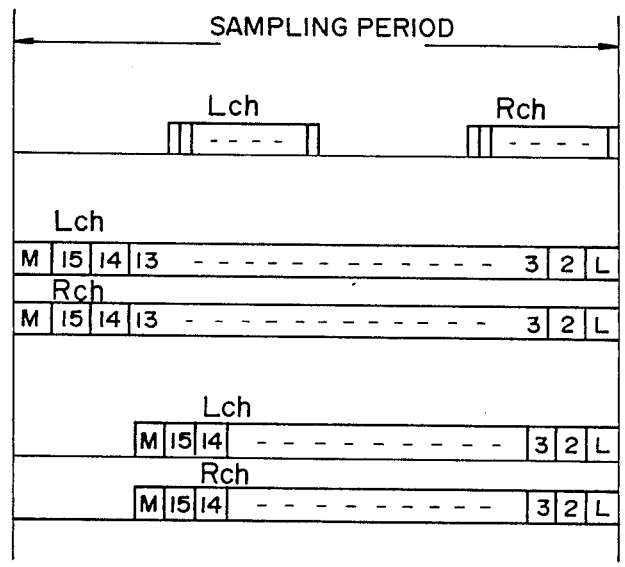
FIG. 37 (a)
FIG. 37 (b)
FIG. 37 (c)

DIGITAL-ANALOG CONVERTER

BACKGROUND OF THE INVENTION

This invention relates to a digital-analog converter, and more particularly, to a digital-analog converter suitable for use in converting a digital audio signal into an analog audio signal.

In compact disc players (CD players) or digital tape recording/playback devices (DAT devices), it is required that musical signals expressed in digital form be converted into analog signals prior to output.

As shown in FIG. 39, a commonly employed digital-analog converter (hereinafter referred to as a "DA converter") for playing back music includes a digital current converter 1 for converting digital data DT, which is inputted at a certain sampling period, into a direct current $I_o$, a current-voltage converter 2 for converting the current $I_o$ into a voltage $S_D$ (see FIG. 40), and for holding the voltage, each time a sampling pulse $P_s$ is generated, and a low-pass filter 3 for forming the output voltage $S_D$ into a continuous, smooth analog signal $S_A$, which is the output of the filter 3. The current-voltage converter 2 includes a switch SW having a movable contact changed over by the sampling pulse $P_s$. When the movable contact is switched to a contact a, as shown in FIG. 39, an integrator is formed to generate the voltage $S_D$, which conforms to the current $I_o$. When the movable contact is switched to a contact b, a holding circuit is formed to hold the voltage $S_D$.

The foremost problems encountered in the DA converter for music playback are the precision with which the digital data is converted into a current value, the speed at which the conversion is made and phase distortion caused by the low-pass filter.

The problems of conversion precision and conversion speed have largely been solved by higher speed LSI's and advances in trimming techniques. Though phase distortion ascribable to the low-pass filter can be mitigated by employing a digital filter, phase distortion cannot be eliminated completely so long as the filter is an integral part of the structure.

FIG. 41 is useful in describing phase distortion. FIG. 41(a) illustrates an original audio signal waveform 5a, a 1 KHz component waveform 5b, and an 8 KHz component waveform 5c. FIG. 41(b) illustrates an audio signal waveform 6a outputted by the low-pass filter 3 (FIG. 39), a 1 KHz component waveform 6b, and an 8 KHz component waveform 6c. It will be understood from these waveforms that, due to the delay in the phase of the 8 KHz component, the output audio signal 6a is different from the original audio signal 5a, and that this phase distortion becomes particularly pronounced at high frequencies. Thus, the presence of the low-pass filter results in a major deterioration in sound quality.

As shown in FIG. 42, the low-pass filter output when a pulsed signal is applied to the filter is sluggish at a leading edge 7a and oscillates at an envelope portion 7b and trailing edge 7c. Consequently, when a musical signal exhibiting a large impulse variation is applied to the low-pass filter, sound quality changes greatly and there are times when even the rhythmical sense of the musical signal differs.

SUMMARY OF THE INVENTION

An object of the present invention is to provide a novel DA converter from which the low-pass filter can be removed.

Another object of the present invention is to provide a DA converter capable of producing a continuous analog signal that is a faithful reproduction, devoid of phase distortion, of an original signal.

A further object of the present invention is to provide a DA converter which, by using unit pulse response signals, converts digital data generated at predetermined times into a continuous analog signal.

According to the present invention, the foregoing objects are attained by providing a DA converter comprising a unit pulse response signal generator for successively generating unit pulse response signals at a predetermined time interval, a digital data generator for generating digital data at the predetermined time interval, a multiplier for multiplying a unit pulse response signal generated at a certain time by a predetermined item of the digital data, and a mixer for producing an analog signal output by combining the unit pulse response signals that have been multiplied by the digital data.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 2 through 5 are views for describing the principle of the invention, in which FIG. 2 is a view for describing time slots for a case where a time axis is divided at intervals of $\Delta T$, FIG. 3 is a view for describing digital data in each time slot, FIG. 4 is a signal waveform diagram of one embodiment of unit pulse response, and FIG. 5 is a pulse response signal waveform diagram corresponding to three continuous digital signal;

FIG. 8 is a waveform diagram of signals associated with the various portions of FIG. 6;

FIG. 9 is a block diagram of the partial signal generator of FIG. 6;

FIG. 10 is a circuit diagram showing an embodiment of the partial signal generator;

FIG. 24 illustrates an embodiment for a case where a de-emphasizing function is provided;

FIG. 25 is a view for describing signals used in a unit pulse response signal generator and digital signal generator;

FIG. 26 is a waveform diagram for describing a reset pulse CCLK in the unit pulse response signal generator;

FIG. 30 is a signal waveform diagram of signals used in the digital signal generator;

FIG. 36 is a waveform diagram of various signals associated therewith;

FIG. 37 is a view for describing a digital data output format;

DESCRIPTION OF THE PREFERRED EMBODIMENT

Figure 1:
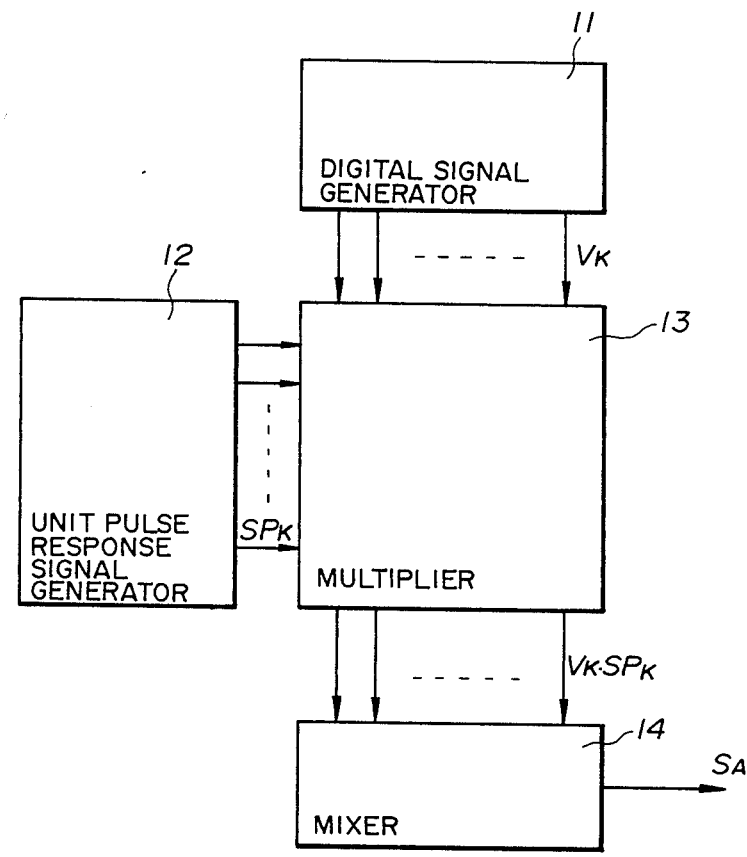
FIG. 1 is a block diagram for describing the general features of the present invention.

FIG. 1 is a simplified block diagram of a digital analog converter according to the present invention.

In FIG. 1, the digital analog converter includes a digital signal generator 11 for generating digital data at a predetermined time interval, a unit pulse response signal generator 12, a multiplier 13 connected to the digital signal generator 11 and unit pulse response signal generator 12, and a mixer 14 for combining a plurality of signals, which are outputted by the multiplier 13, to produce an output signal $S_A$. The unit pulse response signal generator 12 successively generates unit pulse response signals $SP_k$ at a predetermined time interval, and the digital signal generator 11 generates digital data $V_k$ at the predetermined time interval. The multiplier 13 multiplies each unit pulse response signal $SP_k$, which is generated at a certain time, by a predetermined item of the digital data $V_k$. The unit pulse response signals multiplied by the digital data and then outputted by the multiplier 13 are applied to the mixer 14, where these signals are combined to form the analog output signal $S_A$.

Figure 2:
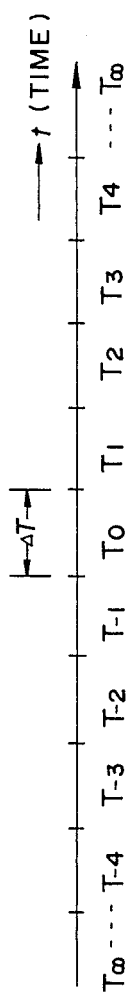
Figure 3:
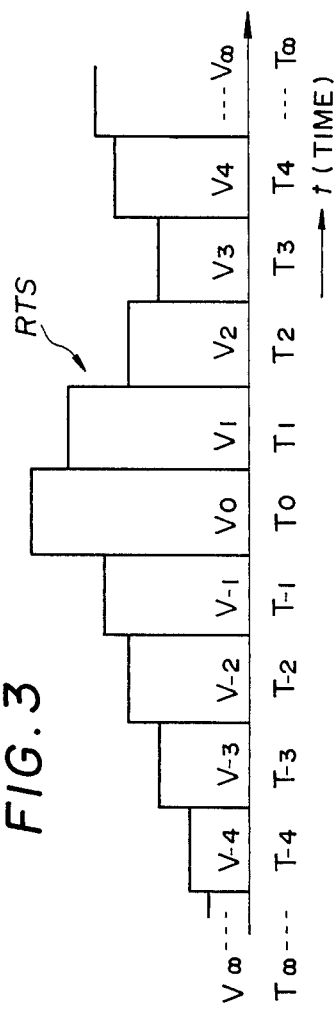

If a time axis is divided at a predetermined time interval $\Delta T$, as shown in FIG. 2, and a discrete time signal value (digital value) in each time slot $T_k$ ($k = \ldots T_{-4}$, $T_{-3}, T_{-2}, T_{-1}, T_0, T_1, T_2, T_3, T_4, \ldots$) is designated by $V_k$, as shown in FIG. 3, then a continuous signal conforming to the discrete time signals RTS is obtained by superposing, along the time axis, pulse response signals weighted by the digital data $V_k$ inputted from one moment to the next.

Figures 4A, 4B:
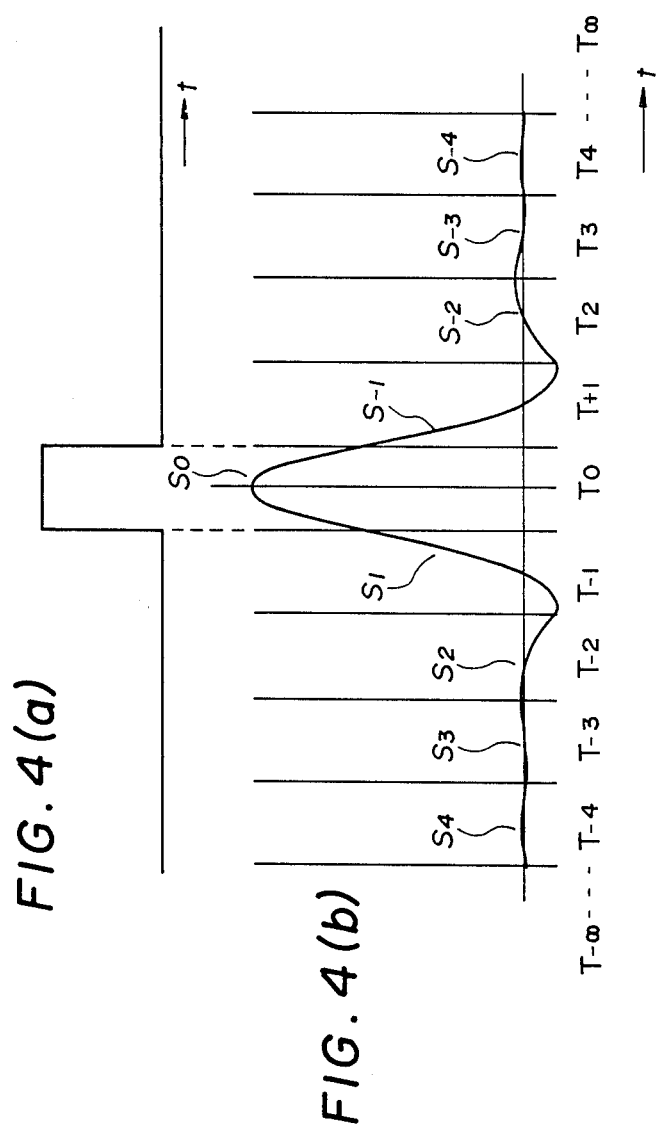

FIG. 4(a) shows a unit pulse in the time slot $T_0$, and FIG. 4(b) illustrates a unit pulse response signal waveform corresponding to the unit pulse signal, namely a spline signal waveform illustrative of an embodiment of the invention. It should be noted that the unit pulse response signal covers an interval extending from $-\infty$ to $+\infty$ on the time axis and is sharply attenuated from the time slot $T_0$ toward $-\infty$ and $+\infty$.

Focusing solely on the digital data $V_{-1}, V_0, V_1$ in the time slots $T_{-1}, T_0, T_1$ of the discrete time signals RTS shown in FIG. 3, it is seen that the pulse response signals $SP_{-1}, SP_0, SP_1$ corresponding to the digital data $V_{-1}, V_0, V_1$ are as indicated by the dashed line, solid line and one-dot chain line, respectively, shown in FIG. 5. Therefore, by combining these pulse response signals in order every $\Delta T$ starting from the old time slot $T_k$ ($k = -\infty, \ldots -2, -1, 0, 1, 2, \ldots \infty$) and outputting the result, a continuous time signal corresponding to the three items of digital data $V_{-1}, V_0, V_1$ is obtained. Note that the pulse response signals $SP_{-1}, SP_0, SP_1$ in FIG. 5 are the result of multiplying the unit pulse response signal [see FIG. 4(b)] by $V_{-1}, V_0, V_1$, respectively.

The foregoing refers to three items of digital data. However, a continuous time signal can be obtained in similar fashion even when the digital data in all of the time slots are considered. In view of the fact that the pulse response signals are sharply attenuated, it will suffice if the number of pulse response signals to be combined in each time slot is nine at most. In other words, let $T_k$ represent the present time slot. If the pulse response signals corresponding to the nine items of digital data in the time slots $T_{k-4}$ through $T_{k+4}$ are combined, a sufficiently accurate continuous time signal is obtained in time slot $T_k$.

Figure 6:
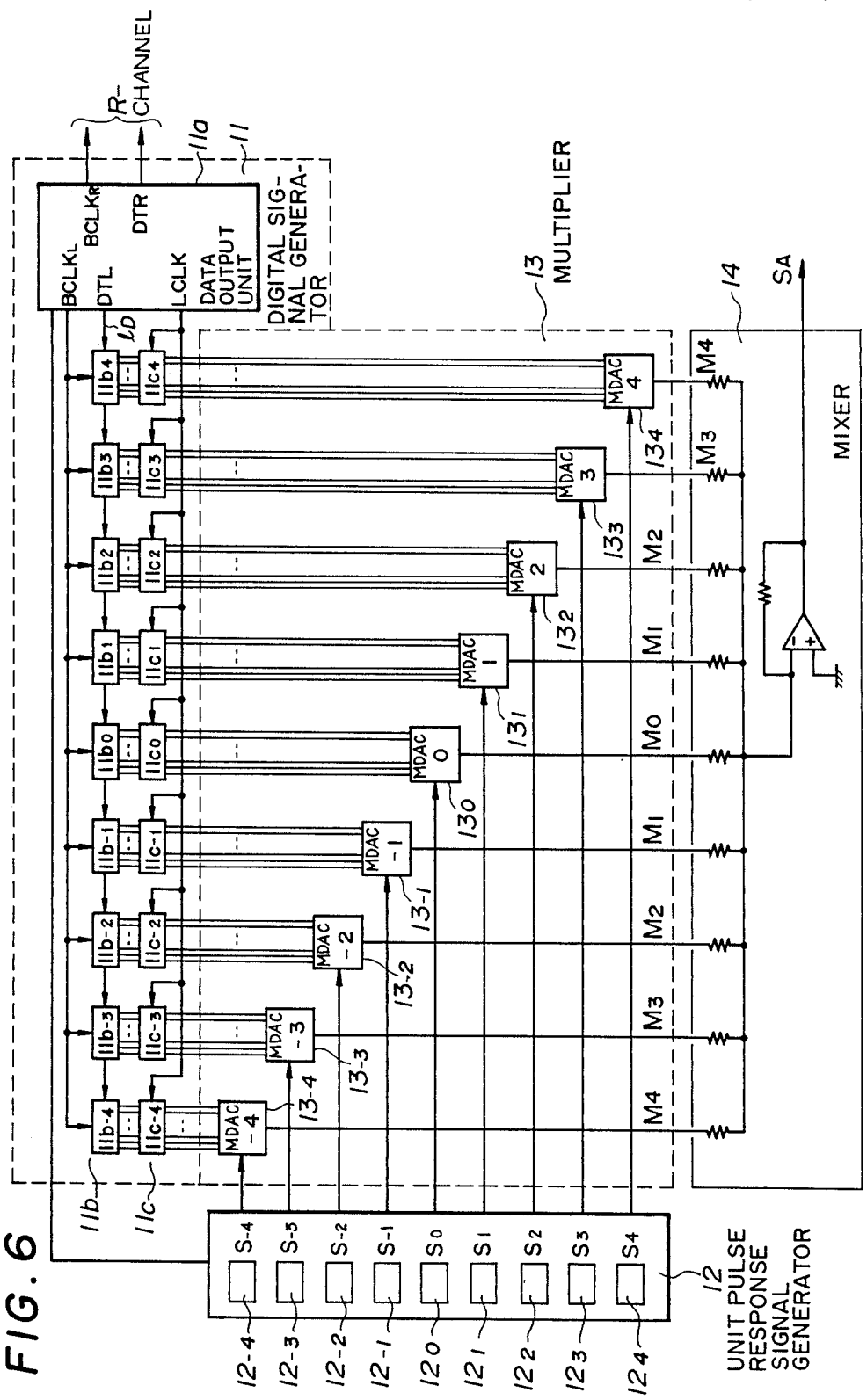
FIG. 6 is a block diagram of a digital analog converter according to the invention.

FIG. 6 is a block diagram of a digital analog converter according to the present invention. Only one channel (e.g. the L-channel) of the converter is illustrated. The digital analog converter shown in FIG. 6 includes the digital signal generator 11, the unit pulse response signal generator 12, the multiplier 13 connected to the digital signal generator 11 and unit pulse response signal generator 12, and the mixer 14 for combining the plurality of signals, which are outputted by the multiplier 13, to produce the output signal $S_A$.

The digital signal generator 11 includes a data output unit 11a for generating the digital data $V_k$ (see FIG. 3) at the predetermined time interval (sampling interval) $\Delta T$, a shift register section 11b composed of n (nine in the embodiment of FIG. 6) stages, and a latch section 11c composed of n stages. On the assumption that the items of digital data are each composed of 16 bits, the shift register section 11b will have 16-bit shift registers $11b_{-4} - 11b_4$ for shifting data in a bit serial, and the latch section 11c will have 16-bit latch circuits $11c_{-4} - 11c_4$. The data output unit 11a sequentially outputs, over a data line $1_D$, digital data (L-channel data) DTL in a bit serial at the sampling time interval, and generates a shift clock $BCLK_L$ at a predetermined timing in synchronization with a bit clock BCLK. In response, the digital data stored in each shift register $11b_k$ is transferred to the next shift register $11b_{k-1}$. After the transfer, the data output unit 11a generates a latch clock LCLK, in response to which the data in each shift register $11b_k$ is latched in the corresponding latch circuit $11c_k$. On the assumption that the present time slot is $T_0$ (see FIG. 3), the data output unit 11a will output digital data $V_4$ in the time slot $T_4$ after a time equivalent to four samplings.

Accordingly, on the assumption that the present time slot is $T_0$, digital data $V_{-4}$ will be stored in shift register $11b_{-4}$ and latch circuit $11c_{-4}$, and digital data $V_{-3}$ will be stored in shift register $11b_{-3}$ and latch circuit $11c_{-3}$.

The same will hold through shift register $11b_4$ and latch circuit $11c_4$, in which the digital data $V_4$ will be stored.

The unit pulse response signal generator 12 generates the signal shown in FIG. 4(b), which represents the unit pulse response signal. The unit pulse response signal generator 12 includes partial waveform generators $12_k$ (k=−4, −3, ... 4) which divide the unit pulse response signal waveform at the time interval $\Delta T$, which is the sampling period, and repeatedly generate n (e.g. 9) partial waveform signals $S_{-4}$, $S_{-3}$, $S_{-2}$, $S_{-1}$, $S_0$, $S_1$, $S_2$, $S_3$ and $S_4$ [see FIG. 4(b)] at the sampling period $\Delta T$.

Figure 7A:
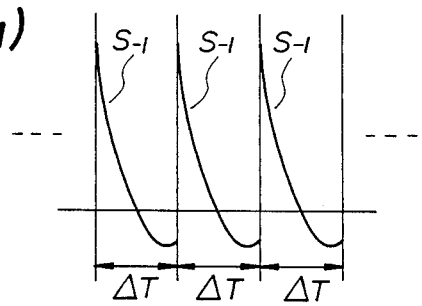
FIG. 7 shows waveform diagrams of outputs produced by a partial waveform signal generator in FIG. 6.
Figure 7B:
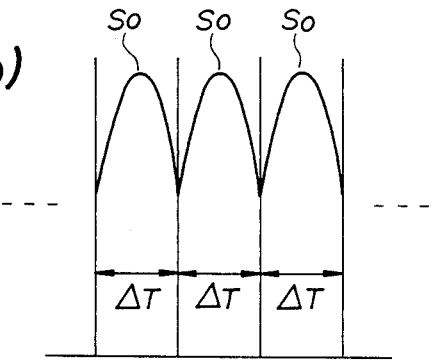
Figure 7C:
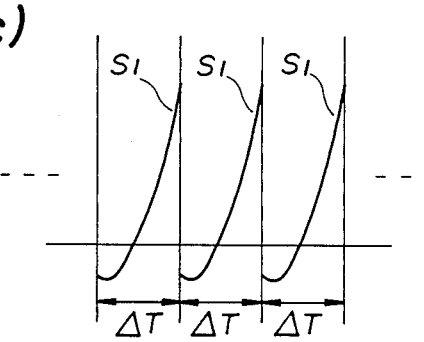

FIG. 7(a) is a signal waveform diagram of the signal generated by the partial waveform generator $12_{-1}$. The partial waveform $S_{-1}$ is generated by the generator $12_{-1}$ repeatedly. FIG. 7(b) is a signal waveform diagram of the signal generated by the partial waveform generator $12_0$. The partial waveform $S_0$ is generated by the generator $12_0$ repeatedly. FIG. 7(c) is a signal waveform diagram of the signal generated by the partial waveform generator $12_1$. The partial waveform $S_1$ is generated by the generator $12_1$ repeatedly.

Thus, the unit pulse response signal generator 12 generates the partial waveforms $S_k$ (k=−4 through 4), namely the unit response signal SP, every sampling period $\Delta T$ and inputs the partial waveforms to the multiplier 13. The reason for using the nine partial waveforms $S_k$ (k=−4 through 4) and not other partial waveforms in addition to these is that the unit response signal is rapidly attenuated at these other portions and is nearly zero, allowing these other partial waveforms to be neglected.

The multiplier 13 includes n (nine in FIG. 6) multiplying-type DA converters (hereinafter referred to as "multiplier circuits") $13_{-4}$ through $13_4$. The multiplier circuit $13_{-4}$ multiplies the digital data stored in the latch circuit $11c_{-4}$ by the partial waveform $S_{-4}$, thereby producing an output analog signal $M_{-4}$. The multiplier circuit $13_{-3}$ multiplies the digital data stored in the latch circuit $11c_{-3}$ by the partial waveform $S_{-3}$, thereby producing an output analog signal $M_{-3}$. Similarly, each multiplier circuit $13_k$ multiplies the digital data stored in the latch circuit $11c_k$ by the partial waveform $S_k$, thereby producing an output analog signal $M_k$. Accordingly, on the assumption that the present time slot is $T_0$, each shift register $11b_k$ and latch circuit $11c_k$ is storing digital data $V_k$, so that each multiplier circuit $13_k$ outputs an analog signal represented by $M_k=S_k V_k$ (k=−4, −3, ..., 3, 4).

The mixer 14 has the construction of a well-known analog adder and produces an output signal by combining the analog signals $M_k$ (=$S_k \cdot V_k$) outputted by the multiplier circuits $13_{-4}$ through $13_4$.

Accordingly, in the time slot $T_0$, the analog signal (continuous time signal) $S_A$ outputted by the mixer 14 is a combined signal composed of a signal (which corresponds to the solid-line portion $M_0$ in time slot $T_0$ in FIG. 5) obtained as a result of multiplying the digital data $V_0$ in the abovementioned time slot by the partial waveform signal $S_0$, a signal (which corresponds to the dashed-line portion $M_{-1}$ in time slot $T_0$ in FIG. 5) obtained as a result of multiplying the digital data $V_{-1}$ in the time slot $T_{-1}$ by the partial waveform signal $S_{-1}$, and a signal (which corresponds to the one-dot chain line portion $M_1$ in time slot $T_0$ in FIG. 5) obtained as a result of multiplying the digital data $V_1$ in the time slot $T_1$ by the partial waveform signal $S_1$.

FIG. 8 is a waveform diagram depicting an original analog signal $S_{OR}$, which is a continuous time signal, the discrete time signals RTS obtained by digitalizing the original analog signal $S_{OR}$ at the sampling period $\Delta T$, the analog signal $M_{-1}$ outputted by the multiplier circuit $13_{-1}$ shown in FIG. 6, the analog signal $M_0$ outputted by the multiplier circuit $13_0$, the analog signal $M_1$ outputted by the multiplier circuit $13_1$, and the combined signal $S_A$ outputted by the mixer 14.

The foregoing is an abbreviated description of the digital analog converter of the present invention.

The various components in the circuit of FIG. 6 will now be described in detail.

FIG. 9 is a block diagram of each partial waveform generator $12_k$ in the unit pulse response signal generator 12. As shown in FIG. 7, the unit pulse response signal generator is adapted to repeatedly and digitally generate the partial waveforms $S_k$ (k=−4, −3, ..., 3, 4) of the unit pulse response signal every sampling period $\Delta T$. More specifically, a counter 21 is cleared of its count by a reset pulse CCLK generated at the sampling period. The counter 21 counts a bit clock signal $BCLK_p$, the frequency of which is $a \cdot f_s$ (where $f_s$ is the sampling frequency), thereby generating an address signal $A_S$ for a ROM 22, which is the next stage.

Digital values of the partial waveform $S_k$ digitalized at an interval of time $1/(a \cdot f_s)$ are stored in the ROM 22 consecutively in the order of the addresses thereof. Therefore, the discrete partial waveforms $S_k$ are obtained if the digital data are read out of the ROM sequentially from storage areas designated by the address signals $A_S$ outputted by the counter 21. The larger a is made, the higher the accuracy of the partial waveform signal $S_k$ obtained. It should be noted that a value of at least 40 will suffice for a, in which case an ordinary bit clock can be used as the bit clock $BCLK_p$.

The digital data outputted by the ROM 22 is latched temporarily by a latch circuit 23. When stability is achieved, the digital data from the latch circuit 23 is inputted to a DA converter 24 for conversion into a current $I_0$ the magnitude whereof is proportional to the digital value. The current $I_0$ is outputted by the DA converter 24. It should be noted that the latch circuit 23 can be dispensed with if the transmitting speed of the counter 21 is high and the reading time of the ROM 22 is short.

The current $I_0$ from the DA converter 24 is converted by a current-voltage converter (IV converter) 25 into a voltage signal proportional to the current value. This voltage signal is then formed into a smooth continuous analog signal by a low-pass filter 26. Finally, the continuous analog signal is formed into the partial waveform signal $S_k$ the impedence whereof is reduced by a buffer amplifier 27. This signal is outputted to a predetermined multiplier circuit $13_k$ shown in FIG. 6. It should be noted that the buffer amplifier 27 can be dispensed with if the output impedance of the low-pass filter 26 is low. Since it will suffice if the partial waveform signal $S_k$ has the required waveform, phase distortion ascribable to the low-pass filter 26 is not a problem. In other words, it will suffice to revise the digital data stored in the ROM 22 to correct for any distortion in the waveform caused by the low-pass filter 26.

The portion of the partial waveform generator $12_k$ from the counter 21 to the DA converter 24 is constituted by integrated circuitry. The larger the number of bits, the smoother the partial waveform signal obtained. Eight bits is sufficient. Since equal digital data must be outputted by the ROM 22 at the same time at every sampling period $T_S (=\Delta T=1/f_s)$, the counter 21 and its outputs $Q_A \sim Q_{XX}$ are cleared by the reset pulse CCLK generated at the sampling period (the shorter the better).

FIG. 10 is a circuit diagram illustrating the actual circuitry of a partial waveform signal generator of eight-bit construction, in which portions similar to those of FIG. 9 are designated by like referece characters. The circuit arrangement of FIG. 10 differs from that of FIG. 9 in that an AND gate 31 and an address shifter 32 are provided.

It is necessary that the latch circuit 23 hold the data from the ROM 22 after stability is achieved. To this end, the AND gate 31 generates a latch clock signal $LCLK_P$ upon taking the AND of the bit clock signal $BCLK_P$ whose frequency is $a \cdot f_s$ ($a=64$) and a clock signal $BCLK_p'$ of frequency $2 \cdot a \cdot f_s$, the latter signal being available in digital audio equipment.

In order to obtain the required S/N ratio, it will suffice if nine partial waveform signals $S_{-4}, S_{-3}, \ldots, S_0, \ldots, S_3, S_4$ are generated. However, since nine types of ROM would then be required to be fabricated for these partial waveform signals, mask cost would rise and write time would become quite lengthy. Since this is undesirable, the single ROM 22 is divided into a minimum of nine storage areas at predetermined address units (64 address units if $a=64$), and digital data for generating the partial waveform signal $S_k$ ($k=-4\sim4$) is stored in each storage area. In this case, the counter 21 can generate only 1-64 address signals. Therefore, it is arranged so that switches SW1-SW4 in the address bias circuit 32 are set to on or off positions to pull the address up or down, thereby enabling each of the nine storage areas to be accessed.

The maximum output $S_{KMAX}$ of the partial waveform signal $S_k$ shown in FIG. 10 is given by the following equation:

$$S_{KMAX} = (V_{DC}/R_1) \cdot (254/256) \cdot R_L \ldots \quad (1)$$

and depends upon a reference voltage $V_{DC}$ and a current control resistance $R_1$ in the DA converter 24, and a feedback resistor $R_L$ in the current-voltage converter 25. The partial waveform signal $S_k$ is supplied to $V_{REF}$ of multiplier circuit (multiplying-type DA converter) $13_k$ in the multiplier 13, thereby deciding the output value of the multiplier circuit. Accordingly, the level of the analog signal $S_A$ outputted by the mixer 14 can be controlled by adjusting the voltage $V_{DC}$ and resistors $R_1$, $R_L$. FIGS. 11 through 17 illustrate embodiments of level control circuits for controlling the level of the analog signal $S_A$ (see FIG. 6), which is the output of the digital analog converter of the invention.

Figure 11:
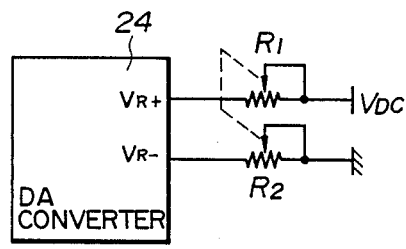
FIGS. 11 through 17 are circuit diagrams of analog signal lever shifters.
Figure 12:
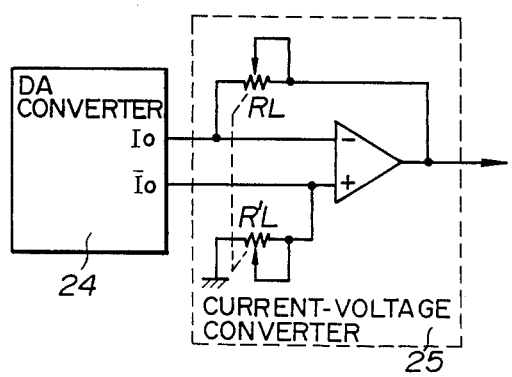
Figure 13:
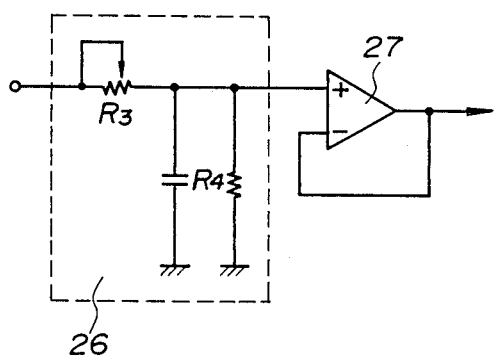
Figure 14:
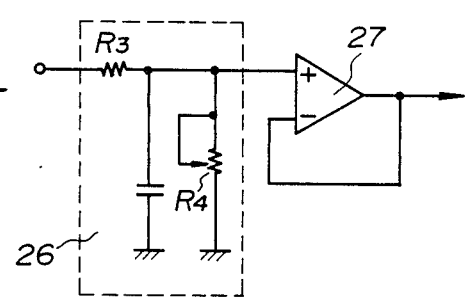
Figure 15:
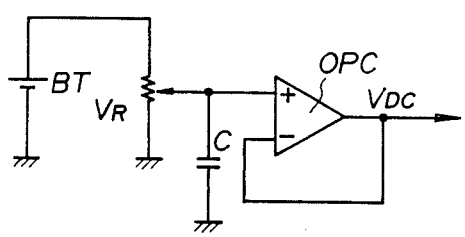
Figure 16:
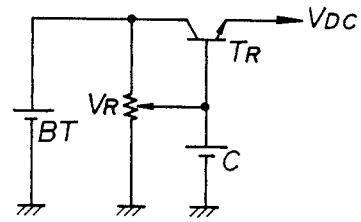
Figures 17, 18, 19:
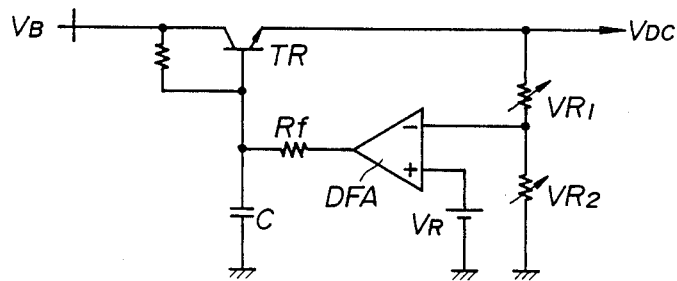
FIGS. 18 and 19 are tables illustrating formulae for computing digital data stored in a ROM in order to generate partial waveform signals.

FIG. 11 illustrates a circuit for controlling the analog signal level, in which the resistance values of resistors $R_1$, $R_2$, which regulate the current value of the DA converter 24, can be varied by ganged-volume adjustment. FIG. 12 illustrates a circuit for controlling the analog signal level, in which the resistance values of feedback resistors RL, RL' in the current-voltage converter 25 can be varied by ganged-volume adjustment. FIGS. 13 and 14 illustrate circuits for controlling the analog signal level by varying resistors $R_3$, $R_4$ in the low-pass filter 26 to change the voltage dividing ratio. FIGS. 15 through 17 illustrate circuits for controlling the reference voltage $V_{DC}$ of the DA converter 24. In FIGS. 15 and 16, BT denotes a battery, VR a variable resistor serving as a volume control for output voltage adjustment, C a capacitor, OPC a differential amplifier, and TR a transistor. FIG. 17 shows a level control circuit constructed as a constant-voltage power supply, in which the output voltage $V_{DC}$ can be controlled by regulating variable resistors $VR_1$, $VR_2$. The arrangement of FIG. 17 includes a reference voltage source $V_R$, a differential amplifier DFA, a feedback resistor $R_f$, and a transistor TR the conductivity of which is controlled so as to output a DC voltage $V_{DC}$ set by the variable resistors $VR_1$, $VR_2$.

In accordance with the level control circuits of FIGS. 11 through 17, the analog signal does not pass directly through the volume resistors and bits in the digital signal are not lost. As a result, the analog output level can be changed without causing distortion.

FIG. 18 is a table useful in describing formulae for computing digital data stored in the ROM 22 in order to generate the partial waveform signals $S_k$ ($k=-4\sim4$) in a case where the low-pass filter 26 is not provided (see FIG. 10). In FIG. 18, t is a numerical value which satisfies the relation $0 \leq t < 1$. The digital values calculated from the formulae in steps of $t/a$, namely when t is made $t/a, 2 \cdot t/a, 3 \cdot t/a, \ldots (a-1) t/a, t$, are successively stored in the nine storage areas of the ROM 22.

It will be understood from the table of FIG. 18 that there is a large difference in the weighting of each $S_k$ ($k=-4 \sim 4$), and that the coefficients of $S_{-4}, S_{-3}, S_3, S_4$ are very small in comparison with the coefficients of $S_0, S_1, S_{-1}$. Consequently, if the digital data of the partial waveform signal $S_k$ is prepared with an accuracy of eight bits based on the computation formulae shown in the table of FIG. 18, it will not be possible to generate accurate partial waveform signals for $S_{-4}, S_{-3}, S_3, S_4$. Therefore, in accordance with the invention, a multiple $A_k$ is found such that the digital values stored in the ROM 22 will fall in the range $-128 \sim +128$, and the digital value given by each computation formula is multiplied by $A_k$ before being stored in the ROM 22. If $A_k S_k (t)$ is expressed by $S_{kROM}(t)$, the relationship between $S_{kROM}$ ($k=-4\sim4$) and $S_k$ will be as shown in FIG. 19.

If the digital values stored in the ROM are thus decided based on the computation formulae illustrated in the table of FIG. 19, then naturally it will be necessary to carry out division by $A_k$ later. One method of performing this division is in accordance with the following:

$$S_k(t) = r_{4k} \cdot S_{kROM}(t)/(r_{3k}+r_{4k}) \ldots \quad (2)$$

by adjusting the values ($r_{3k}$, $r_{4k}$) of the resistors $R_3$, $R_4$ in the low-pass filter 26 (FIG. 10). In the above, $$1/A_k = r_{4k}/(r_{3k}+r_{4k}) \ldots \quad (3)$$

In the absence of the low-pass filter 26, the resistors $R_3$, $R_4$ are inserted. With this method, weighting can be performed as indicated by Eq. (2), but the value of $S_k$ becomes very small and a deterioration in the S/N ratio would occur due to the influence of system noise in the transmission system or multiplier circuit $13_k$ (FIG. 6).

Figures 20, 22, 23:
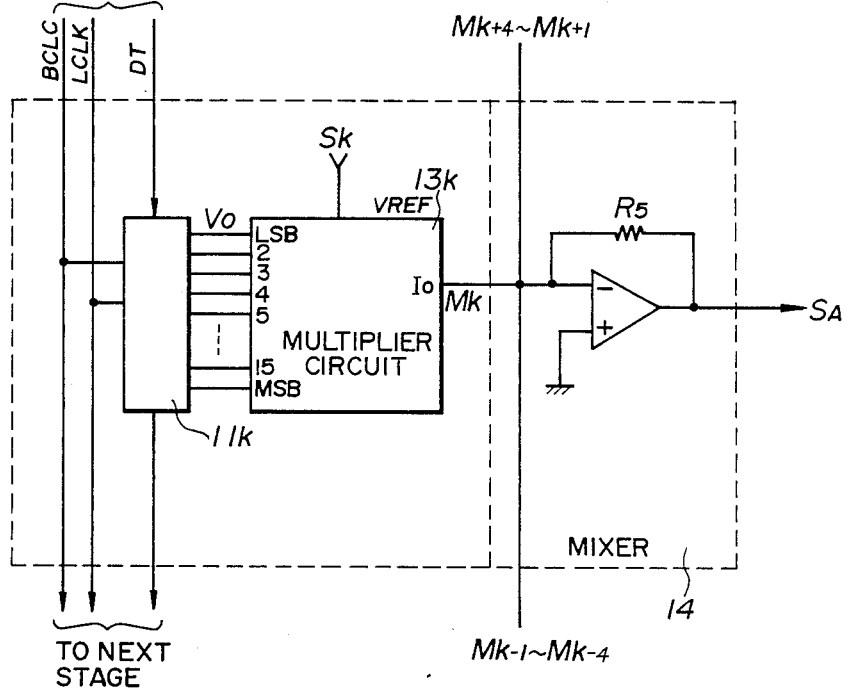
FIG. 20 is a view showing the relationship among a shift register with a latch, a mulitplier circuit and a mixer.
FIGS. 22 and 23 are tables for describing an adjustment resistance value, and a method of adjusting the same, in the weighting circuit of FIG. 21.

If transmission system noise, noise in the multiplier circuits or a mutual level deviation can be tolerated, $1/A_k$ is performed by adjusting the resistance values. FIG. 20 is a view showing showing the relationship among components in a case where the analog signal $S_A$ is generated using a partial waveform signal $S_k$ obtained as a result of division by $A_k$ achieved by adjusting the resistance values. In FIG. 10, numeral $11_k$ denotes a latching shift register which functions as both the shift register $11b_k$ and latch circuit $11c_k$ in FIG. 6. Numeral $13_k$ denotes a multiplying-type DA converter (multiplier circuit) for multiplying the digital data $V_k$ and partial waveform signal $S_k$ and outputting an analog output (analog current) the value of which is proportional to the product of the multiplication. Numeral 14 denotes a mixer which, letting $r_5$ represent the resistance value of a feedback resistor R5, produces an analog output $S_A$ the voltage e of which is as follows:

$$e = r_5 \cdot M_{-4} + r_5 \cdot M_{-3} + \ldots r_5 \cdot M_0 + \ldots + r_5 \cdot M_4$$
$$= r_5 \Sigma M_k$$

The analog output can be increased if the resistance value $r_5$ is increased and decreased if $r_5$ is decreased.

Figure 21:
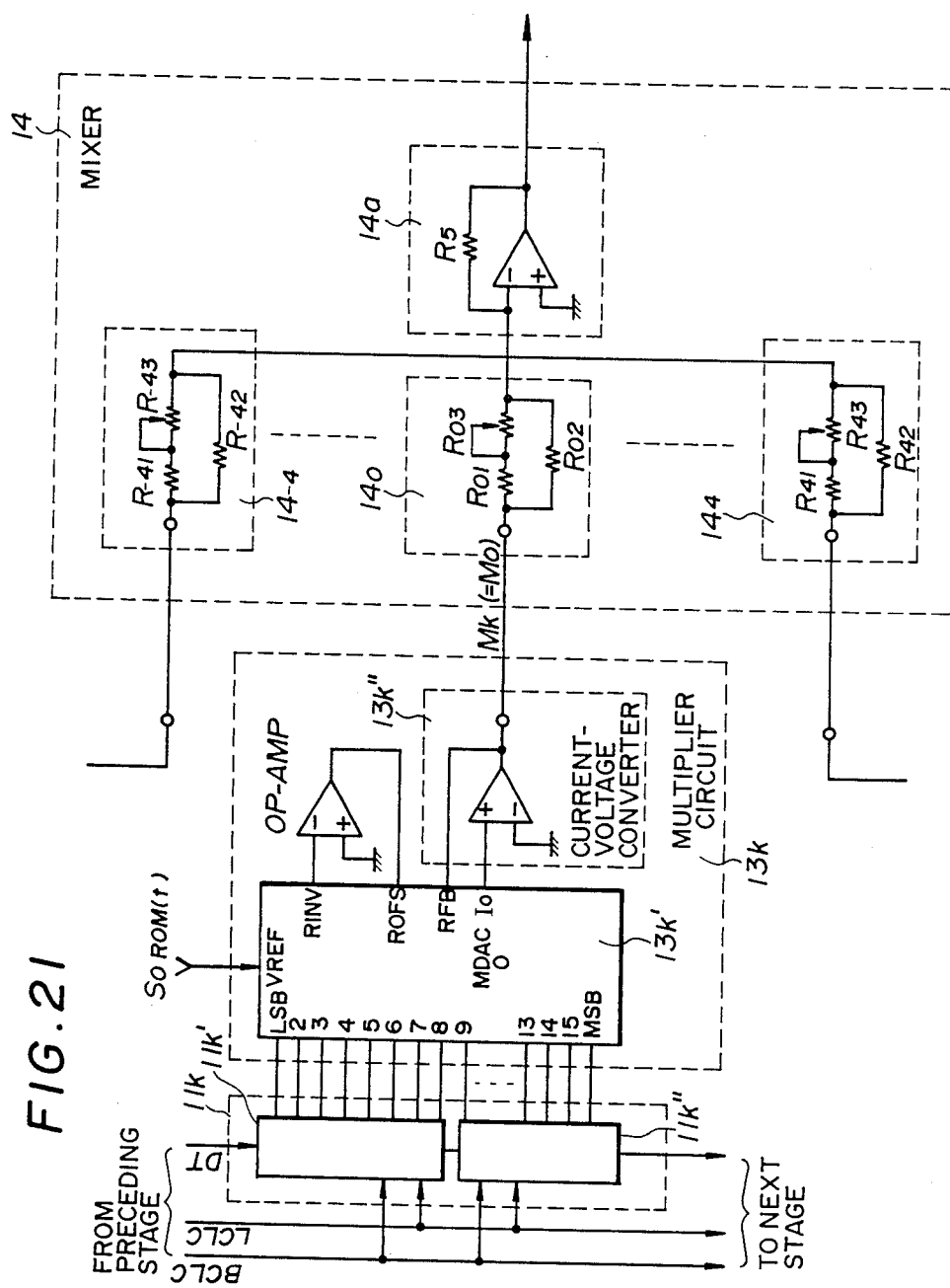
FIG. 21 is a view showing the relationship among various components for a case where the mixer is provided with a $1/A_k$ weighting circuit.

In a case where transmission system noise, noise in the multiplier circuit $13_k$ and a level deviation cannot be tolerated, division by $A_k$ is carried out before formation of the multiplier circuit output $M_k$ obtained based on the partial waveform signal $S_{kROM}(t)$ (k=$-4\sim4$) multiplied by $A_k$. FIG. 21 is a view useful in describing the relationship among the various components in such case. In FIG. 21, numeral $11_k$ denotes the latching shift register which functions as both the shift register $11b_k$ and latch circuit $11c_k$ in FIG. 6, and which includes two serially connected eight-bit IC circuits $11_k'$, $11_k''$. Numeral $13_k$ denotes a multiplying-type DA converter (multiplier circuit) which includes an IC circuit section $13_k'$ for multiplying the digital data $V_0$ and partial waveform signal $S_{0ROM}$ and outputting a current the value of which is proportional to the product of the multiplication, and a current-voltage converter $13_k''$ for converting this current into a voltage signal (the analog output $M_k$). By virtue of this current-voltage conversion, the output of the IC circuit $13_k'$ can be reduced in impedance. This is advantageous in terms of transmission noise. Numeral 15 denotes the mixer, which is constructed in the form of an analog adder. The mixer includes weighting circuits $14_k$ ($14_{-4}\sim14_4$) for dividing the respective multiplier circuit outputs $M_k$ (k=$-4\sim4$) by $A_k$, and an analog adding operational amplifier $14a$ to which the outputs of the weighting circuits are applied. Each weighting circuit $14_k$ includes resistors $R_{k1}$, $R_{k2}$, $R_{k3}$ connected as shown, with the resistor $R_{k3}$ being adjustable. Providing the weighting circuits 14 as close to the operational amplifier $14a$ as possible is advantageous in terms of noise reduction.

Let $Z_k$ represent the impedance of the weighting circuit $14_k$. Since an analog output indicated by the equation $$A_{V_k} = M_k \cdot R_5 / Z_k \ldots \quad (4)$$

is obtained with regard to the analog output $M_k$ from the multiplier circuit $13_k$, the analog signal $S_A$ outputted has a voltage value indicated by $$A_{OUT} = \Sigma A_{V_k} \ldots \quad (5)$$

for all k=$-4 \sim$ k=4.

Letting $R_5/Z_k$ of the weighting circuit $14_0$ corresponding to the partial waveform signal $S_{0ROM}$ be 1000, the values of $R_5/Z_k$ regarding the other partial waveform signal $S_{kROM}$ (k=$-4\sim4$) will be as shown in the table of FIG. 22. Letting $R_5/Z_0=1$, we have $$A_{OUT} = M_{-4}/340 + M_{-3}/57.9 + M_{-2}/10.1 +$$
$$M_{-1}/1.72 + M_0 + M_1/1.72 + M_2/10.1 +$$
$$M_3/57.9 + M_4/340$$

$Z_k$ is determined from the table shown in FIG. 22. In order to absorb a statistical variance in the level of the DA converter 24 shown in FIG. 10 and a statistical variance in the level of each multiplier circuit $13_k$, it is possible to adjust the resistor $R_{k3}$ of the weighting circuit $14_k$. System error can be reduced by this adjustment. The adjustment method is carried out in accordance with the following steps (i)-(iii):

(i) The switches SW1-SW4 in the address bias circuit 32 of FIG. 10 are turned on or off selectively in dependence upon the partial waveform signals $S_k$, and the address output of the counter 21 is fixed to a predetermined address to maximize the absolute value of the output data from the ROM 22. Digital data which counterbalances the reference frequency (1 KHz) is applied to the shift register $11b_k$ (FIG. 6).

(ii) Thereafter, each adjustment resistor $R_{k3}$ is adjusted in such a manner that the output voltage of each weighting circuit $14_k$ takes on the value shown in the table of FIG. 23.

There are cases where a de-emphasizing circuit is necessary in order to process digital data that has been emphasized. In such cases, inserting an amplifier having a de-emphasizing effect invites a deterioration in sound quality. Accordingly, in view of the fact that the voltage value $A_{OUT}$ of the analog signal $S_A$ may be expressed as follows from Eqs. (4) and (5):

$$A_{OUT} = [\Sigma(M_k/Z_k)] \cdot R_5$$

$R_5$ is modified into an impedance $Z_{DE}$ having a de-emphasizing function so that a de-emphasizing function can be introduced into the system without adding components to the system. FIG. 24 is a view for describing a feedback resistance network RNW in a case where the mixer 14 is provided with a de-emphasizing function. The arrangement is such that de-emphasis is applied by varying the impedance of the feedback resistance network in dependence upon the signal frequency. In FIG. 24, $R_9$ is a resistor for preventing shock noise and is related to the other resistors as follows: $R_9 >> R_6$, $R_7$, $R_8$.

FIG. 25 is a view for describing signals associated with the various components of the digital signal generator (FIG. 6) and unit pulse response signal generator (FIG. 10).

Letting $f_s$ represent the sampling frequency of the digital data, the frequency of the bit clock signal $BCLK_P$ in the unit pulse response signal generator of FIG. 10 will be $a \cdot f_s$, and the period of the reset pulse CCLK which resets the counter 21 will be $1/f_s$. Whenever the bit clock $BCLK_P$ is generated, the counter 21 is incremented to generate an address signal for accessing the ROM 22. The latch circuit 23 latches the output of the ROM 22 every $1/f_s$, with the latch clock $LCLK_P$ being the AND of the bit clocks $BCLK_P$, $BCLK_{p'}$. In FIG. 6, the frequency of the bit clock BCLK for the bit-serial shift of the data stored in each shift register $11b_k$ is $b \cdot f_s$, and the period of the latch clock LCLK for latching the contents of the shift registers in the latch circuits is $1/f_s$. Though the larger a, the better, as set forth earlier, a=b is usually the case.

FIG. 26 is a waveform diagram useful in describing the reset pulse in the unit pulse response signal generator (FIG. 10). Data DTL, DTR in two systems, namely the L-channel data and R-channel data, are sampled during one sampling period. A timing signal WCK is at a high level while the data DTL, DTR of the respective channels are being outputted by the data output unit 11a (FIG. 6). The reset pulse CCLK is generated in synchronization with the leading edge of a sampling signal SMP, thereby resetting the value of the count in counter 21 (FIG. 10). In order to minimize delay at the time of the leading edge of the partial waveform signal $S_k$, the pulse width $t_c$ of the reset pulse CCLK is minimized under the condition that $t_c \geq t_R$ holds, where $t_R$ is the length of time required for the IC used to judge that a reset has taken place.

Figure 27:
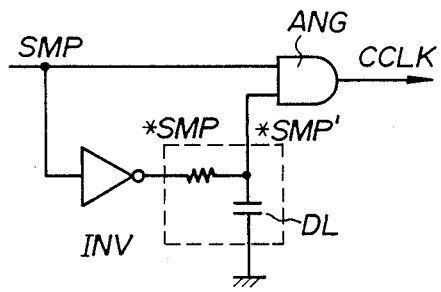
FIG. 27 is a waveform diagram of a reset pulse generator circuit.
Figure 28:
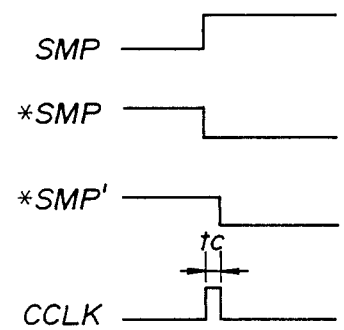
FIG. 28 is a waveform diagram of various signals associated therewith.

The reset pulse CCLK is formed using a signal which produces a level change at the sampling instant, e.g. the sampling signal SMP in FIG. 26. FIG. 27 is a circuit diagram of a reset pulse generating circuit, and FIG. 28 is a waveform diagram of various signals associated with the reset pulse generating circuit. In FIG. 27, an inverter INV inverts the sampling signal SMP, a delay circuit DL composed of a resistor and capacitor delays the inverter output *SMP a predetermined period of time to produce a delayed signal *SMP', and an AND gate ANG generates the reset pulse CCLK by taking the AND of the sampling signal SMP and delayed signal SMP'.

Figure 29:
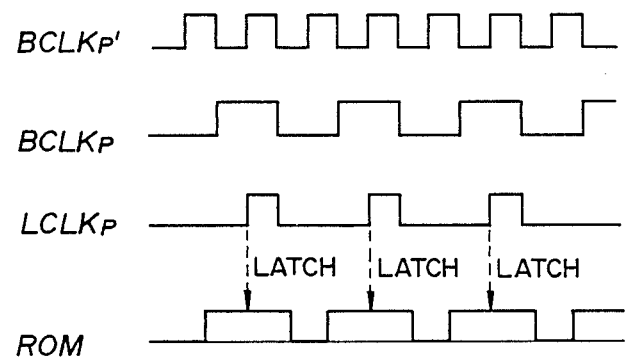
FIG. 29 is a view for describing latch clock waveforms in the unit pulse response signal generator.

The latch circuit 23 in FIG. 10 latches and holds the outputs of the ROM 22, whereby the operation of the DA converter 24, which is the next stage, is rendered more reliable. Accordingly, it is required that the latch clock $LCLK_P$ be generated at the moment all outputs of the ROM 22 become stable. Considering the stabilization delay time of the ROM 22, latching is not performed immediately after generation of the reset pulse $CCLK_P$. Taking into account the maximum delay time (about 85 ns) of the output at counter 21, it is necessary that the latch clock $LCLK_P$ be generated after a delay of 120 ns from the moment the bit clock $BCLK_P$ is produced. Under these conditions, a method of effecting latching upon stabilization in case of $f_s=32$ KHz for a PCM broadcast, $f_s=48$ KHz for DAT and $f_s=44.1$ KHz for CD entails that latching be performed upon effecting a ¾ period delay of the bit clock $BCLK_P$. Accordingly, in the present invention, the logical product of the bit clock $BCLK_P$ whose frequency is $a \cdot f_s$ and the bit clock $BCLK_{P'}$ whose frequency is $2 \cdot a \cdot f_s$ is taken at the AND gate 31, and the output of the AND gate 31 is used as the latch clock $LCLK_P$. The relevant waveforms are shown in FIG. 29.

FIG. 30 is a waveform diagram of signals used in the digital signal generator 11. The bit clock BCLK is for shifting the contents of the shift registers $11b_k$ in a bit serial. TCLL, TCLR represent timing signals which attain the high level when the L-channel data DTL and R-channel data DTR, respectively, are outputted by the data output unit 11a (see FIG. 6). $BCLK_L$, $BCLK_R$ denote shift clock signals for shifting the L- and R-channel digital data (16-bit data) in a bit serial. LCLK is a latch clock signal for latching the contents of the shift registers $11b_k$ in the latch circuits $11c_k$.

Figure 31:
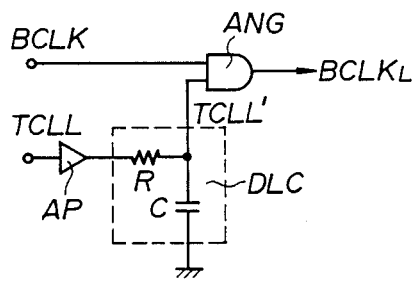
FIG. 31 is a circuit diagram of a shift clock generator.
Figure 32:
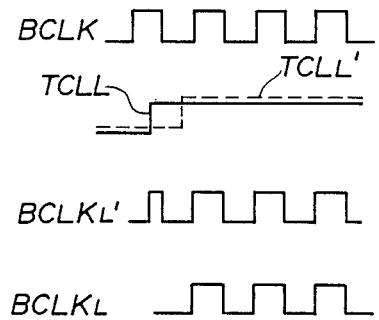
FIG. 32 is a waveform diagram of various signals associated therewith.

The shift clock signals $BCLK_L$, $BCLK_R$ prevent overshifting of data to the next shift register and assure feed-in of the data. Basically, the logical product is taken of each of the timing signals TCLL, TCLR and the bit clock signal BCLK. However, owing to a very small discrepancy in the timings of the bit clock BCLK and each of the timing signals TCLL, TCLR, there is the danger that a needless shift clock will be generated before or after the normal shift clock signal. In the likelihood of such danger, it is necessary that the bit clock BCLK or timing signals TCLL, TCLR be delayed several tens of nanoseconds. FIG. 31 is a circuit diagram of a circuit for generating the L-channel shift clock $BCLK_L$, and FIG. 32 is a waveform diagram of the associated waveforms. In FIG. 31, a delay circuit DLC composed of a resistor R and capacitor C applies a predetermined time delay to the timing signal TCLL, which is outputted by an amplifier AP, thereby generating a delayed signal TCLL'. An AND gate ANG generates the shift block signal $BCLK_L$ by taking the logical product of the shift clock signal BCLK and the delayed signal TCLL'. In FIG. 32, BCLKL' represents a shift clock which results when a delay is not applied. It will be seen that an extra shift clock is generated.

Figure 34:
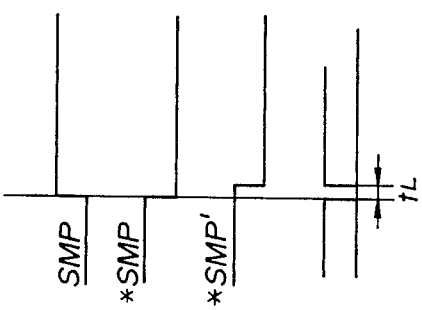
FIG. 34 is a waveform diagram of various signals associated therewith.
Figure 33:
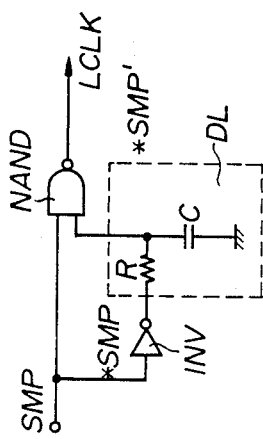
FIG. 33 is a circuit diagram of a latch clock generator.

It is required that the pulse width $t_L$ of the latch clock LCLK be made very small under the condition $t_L \geq t_M$ (where $t_M$ is the maximum time required for latching upon stabilization) in order to make the apparent settling time of the multplier circuit $13_k$ very short. The latch clock signal LCLK is produced by an inverter INV, delay circuit DL and NAND gate NAND, as shown in FIGS. 33 and 34, using the sampling signal SMP, as was the case for the reset pulse CCLK (see FIGS. 27 and 28). It should be noted that the reset pulse CCLK and latch clock signal LCLK must have an identical timing.

In a case where the timing signals TCLL, TCLR are absent but the timing signal WCK (see FIG. 26) is present, the L-channel timing signal TCLL is generated by taking the logical product of the sampling signal SMP and timing signal signal WCK. The R-channel timing signal TCLR is generated by taking the logical product of the timing signal WCK and an inverted signal *SMP, which is obtained by inverting the sampling signal SMP using an inverter.

Figure 35:
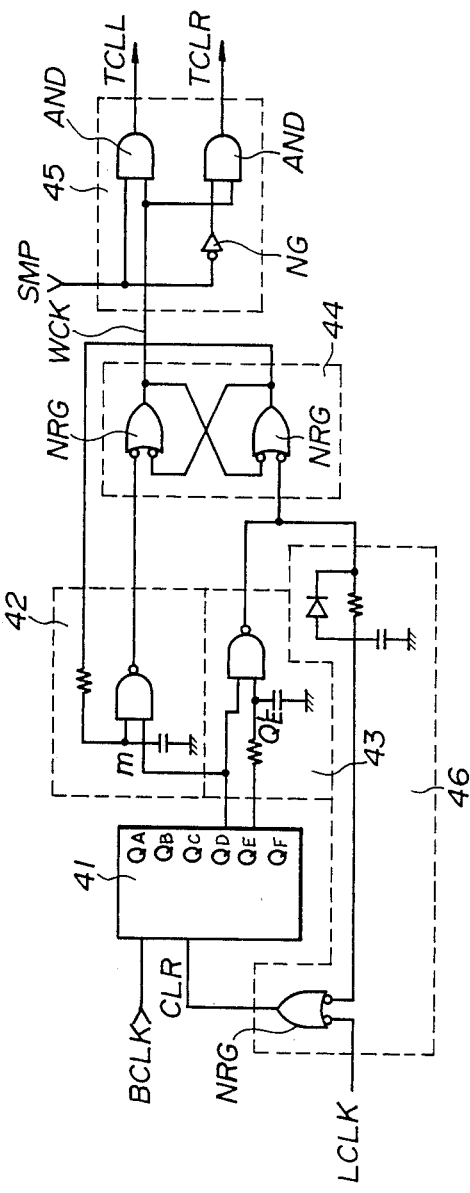
FIG. 35 is a circuit diagram of a timing signal generator.

In a case where the most significant bitt (MSD) of the digital data rises and an m-th trailing edge of the bit clock BCLK and the least significant bit (LSB) decays at an l-th trailing edge of the bit clock BCLK, a counter and a gate are used to generate the timing signals TCLL, TCLR. FIG. 35 shows a timing signal generator circuit for a case where m=8, l=24, and FIG. 36 shows the associated waveforms. In FIG. 35, the timing signal generator circuit includes a binary counter 41 for counting the bit clock signal BCLK, an m detecting circuit 42 for detecting that the count in counter 41 has attained a value of m (=8), an l detecting circuit 43 for detecting that the count in counter 41 has attained a value of l (=24), a latch circuit 44 composed of NOR gates NRG the output from the lower one of which is initially at a high level, a gate circuit 45 for generating the timing signals TCLL, TCLR from the sampling signal SMP and the timing signal WCK, which is the latch output, and a circuit 46 for generating a signal CLR that clears the counter 41. LCLK is a latch clock signal generated at a period $1/f_s$. Further, NAND denotes a NAND gate, NRG a NOR gate, AND an AND gate and NG a NOT gate. FIG. 35 shows the circuit arrangement for 16-bit data. However, in a case where 18-bit data is handled and the MSB of this data rises at m=6 and falls at l=24, the arrangement would be such that the AND of the output terminals $Q_B$, $Q_C$ of counter 41 instead of the $Q_D$ output terminal thereof would be inputted to the m detecting circuit 42.

Though the foregoing is for a case where the output timings of the L-channel data and R-channel data differ [see (a) in FIG. 37], it is permissible to adopt an arrangement in which the data on both channels are outputted at an identical timing, as shown in (b) and (c) of FIG. 37. In such case, the timing signals TCLL, TCLR are exactly the same and the gate circuit 45 in FIG. 35 is no longer required.

Figure 38:
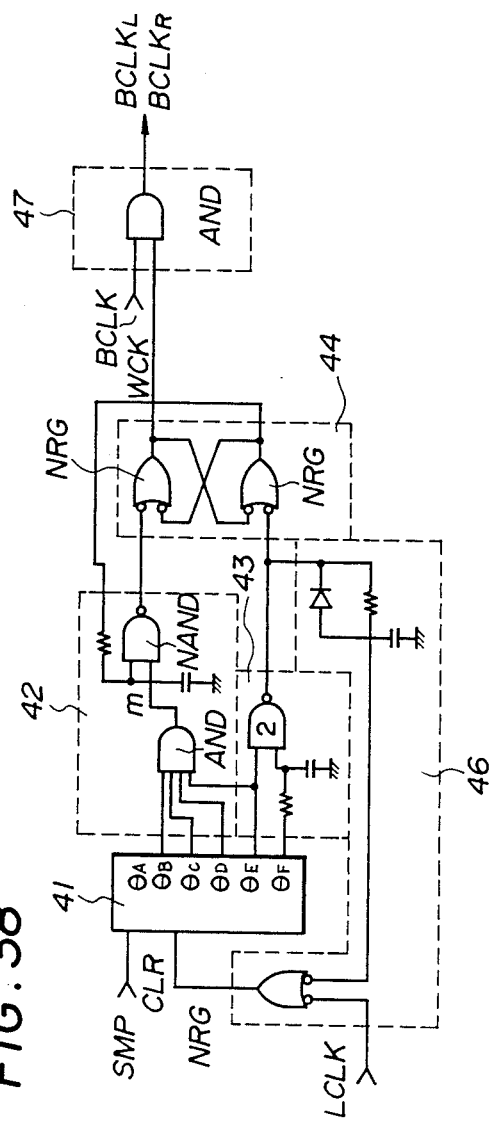
FIG. 38 is a circuit diagram of another shift clock generator.
Figure 39:
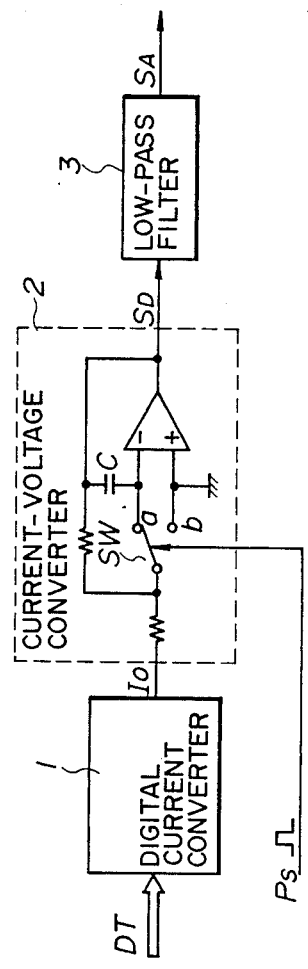
FIG. 39 is a block diagram showing a digital analog converter according to the prior art.
Figure 40:
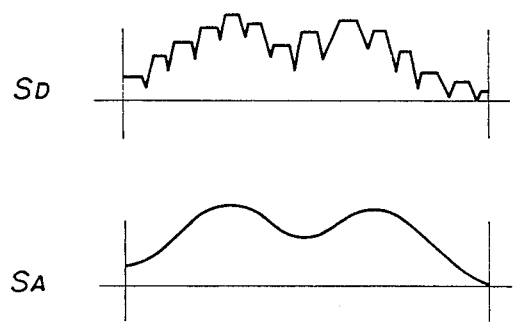
FIG. 40 is a waveform diagram of signals associated therewith.
Figure 42:
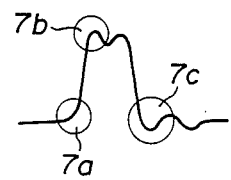
FIGS. 41 and 42 are views for describing phase distortion and waveform distortion in the digital analog converter of the prior art.
Figure 41A:
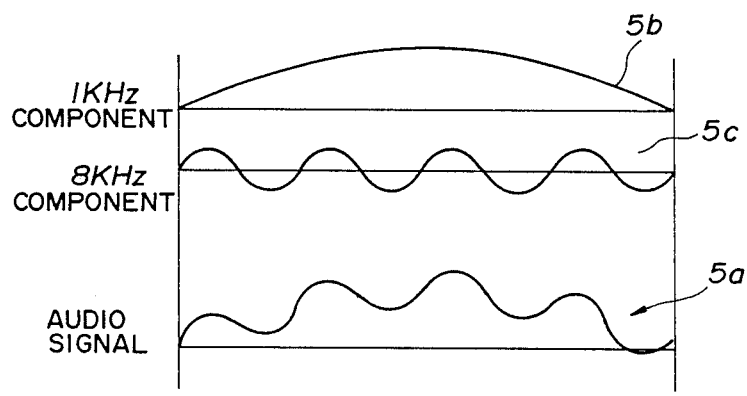
Figure 41B:
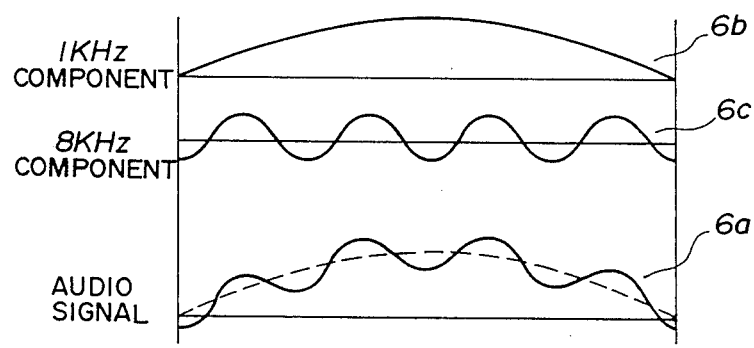
Figures 20, 22, 23:
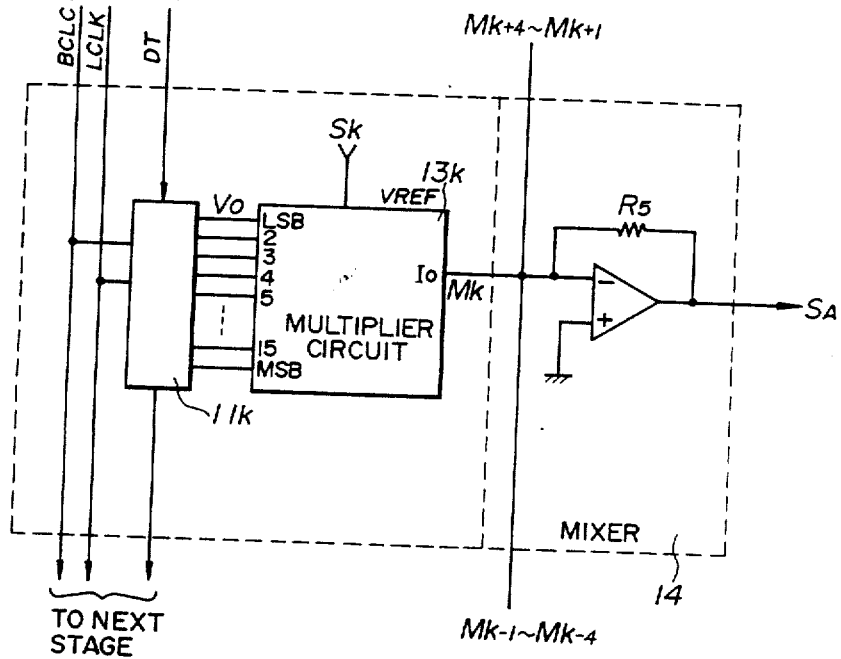

FIG. 38 illustrates a shift clock generating circuit for generating shift clocks $BCLK_L$, $BCLK_R$ which rise at the 30th bit clock BCLK and decay at the 48th bit clock BCLK. Portions similar to those shown in FIG. 35 are designated by like reference characters. The circuit of FIG. 38 differs from that of FIG. 35 in the following aspects:

(i) an AND gate circuit 47 is provided for outputting the shift clocks $BCLK_L$, $BCLK_R$ by taking the AND of the bit clock BCLK and the timing signal WCK;

(ii) the m detecting circuit 42 is arranged to detect a counted value 30 in the counter 41;

(iii) the l detecting circuit 43 is arranged to detect a counted value 48 in the counter 41; and (iv) the gate circuit 45 for generating the timing signal is eliminated.

Thus, in accordance with the present invention, unit pulse response signals are generated successively at a predetermined time interval, digital data DT are generated at the predetermined time interval, a unit pulse response signal generated at a certain time is multiplied by predetermined item of the digital data, and the unit pulse response signals multiplied by the digital data are combined to produce an analog output signal $S_A$, thereby effecting a digital-analog conversion. Accordingly, it is possible to dispense with the low-pass filter for forming the continuous waveform. As a result, an analog signal can be generated that is free of phase distortion and, hence, is a faithful reproduction of an original signal.

As many apparently widely different embodiments of the present invention can be made without departing from the spirit and scope thereof, it is to be understood that the invention is not limited to the specific embodiments thereof except as defined in the appended claims.

What we claim is:

1. A digital-to-analog converter comprising:
    a unit pulse response signal generator for successively generating unit pulse response signals at a predetermined time interval;
    a digital data generator for generating digital data at said predetermined time interval;
    a multiplier for multiplying a unit pulse response signal generated at a certain time by a predetermined item of said digital data; and
    a mixer for producing an analog signal output by combining the unit pulse response signals that have been multiplied by said digital data.

2. The digital-to-analog converter according to claim 1, wherein said multiplier outputs $V_k SP_k$, where $SP_k$ represents a unit pulse response signal generated at the predetermined time interval, and $V_k$ represents an item of the digital data generated at the predetermined time interval.

3. The digital-to-analog converter according to claim 1, wherein when a unit pulse response signal waveform is divided at said predetermined time interval, said unit pulse response signal generator includes n partial waveform generators (where n is a positive integer) for generating respective ones of partial waveform signals obtained by the division at said time interval;
    said digital data generator includes shift registers for storing, while successively shifting, n items of latest digital data generated at the predetermined time interval;
    said multiplier includes of n multiplier circuits for multiplying the partial waveform signal generated by each partial waveform generator by a predetermined digital value stored in one of the shift registers corresponding to said partial waveform signal; and
    said mixer produces the analog signal output by combining signals outputted by said multiplier circuits.

4. The digital-to-analog converter according to claim 3, wherein each multiplier circuit in said multiplier outputs $V_k S_k$, where $S_k, S_{k-1}, \ldots, S_1, S_0, S_1, \ldots, S_{-k}$ successively represent the partial waveform signals obtained when the unit pulse response signal waveform is divided at the predetermined time interval, and $V_{-k}, V_{-(k-1)}, \ldots, V_{-1}, V_0, V_1, \ldots, V_k$ represent the digital data in order from oldest to newest.

5. The digital-to-analog converter according to claim 4, wherein k=4.

6. The digital-to-analog converter according to claim 3, wherein each of said partial waveform generators comprises:
    an address counter for counting frequency pulses having a period which is 1/a of said predetermined time interval (where a is a positive integer);
    a ROM for storing the partial waveform signals discretely in a of storage areas designated by said address counter; and
    a converter for converting, into an analog signal, digital signals successively read out of said ROM.

7. The digital-to-analog converter according to claim 6, wherein each of said partial waveform generators generates a partial waveform signal discretely at a second time interval shorter than said predetermined time interval, each of said multiplier circuits executes said multiplication at said second time interval, and said mixer produces the analog signal output by combining the outputs of said multiplier circuits.

* * * * *

UNITED STATES PATENT AND TRADEMARK OFFICE
CERTIFICATE OF CORRECTION

PATENT NO. : 4,862,170

DATED : August 29, 1989

INVENTOR(S) : Youichi Hashimoto, et al

It is certified that error appears in the above-identified patent and that said Letters Patent is hereby corrected as shown below:

IN THE DRAWINGS: Sheet with Figs. 20, 22 and 23 has been added see attached sheet.

Col. 2, line 42, "signal" should be --signals--.

Col. 4, line 12, "$\Delta T$" should be --$\Delta T$--;
      line 44, "$\Delta T$" should be --$\Delta T$--;
      line 51, "$11c-4-11c_4$" should be --$11c_{-4}-11c_4$--;
      line 52, "$1_D$" should be --$\ell_D$--.

Col. 5, line 8, "$\Delta T$" should be --$\Delta T$--;
      line 11, "$\Delta T$" should be --$\Delta T$--;
      line 25, "$\Delta T$" should be --$\Delta T$--.

Col. 6, line 2, "$\Delta T$" should be --$\Delta T$--;
      line 18, "$\Delta T$" should be --$\Delta T$--;
      line 68, "$(=\Delta T=1/f_s)$" should be --$(\Delta T=1/f_s)$--.

Col. 8, line 19, "$\leq$" should be --$\leq$--;
      line 64, delete "showing" (2nd occurrence).

Col. 9, line 50, "14" should be --$14_k$--.

Col. 11, line 16, "$t_c \geq t_R$" should be --$t_c \geq t_R$--.

UNITED STATES PATENT AND TRADEMARK OFFICE
CERTIFICATE OF CORRECTION

PATENT NO. : 4,862,170

DATED : August 29, 1989

INVENTOR(S) : Youichi Hashimoto, et al

It is certified that error appears in the above-identified patent and that said Letters Patent is hereby corrected as shown below:

Col. 12, line 23, "$\geq$" should be --$\geq$--;
       line 46, "1" should be -- $\ell$ --;
       line 49, "1" should be -- $\ell$ --;
       line 54, "1" should be -- $\ell$ --;
       line 55, "1" should be -- $\ell$ --;
       line 68, "1" should be -- $\ell$ --.

Col. 13, line 25, "1" should be -- $\ell$ --.

Col. 14, line 21, delete "of";
       line 46, delete "of".

Signed and Sealed this

Twenty-eighth Day of August, 1990

Attest:

HARRY F. MANBECK, JR.

*Attesting Officer*       *Commissioner of Patents and Trademarks*

| | S-4ROM | S-3ROM | S-2ROM | S-1ROM | S0ROM | S1ROM | S2ROM | S3ROM | S4ROM |
|---|---|---|---|---|---|---|---|---|---|
| $R_5/Z_k$ | 2.940 | 17.28 | 99.22 | 582.6 | 1000 | 582.6 | 99.22 | 17.28 | 2.940 |

| | R±43 | R±33 | R±23 | R±13 | R03 |
|---|---|---|---|---|---|
| AvK | 2940mV | 17.28mV | 99.22mV | 582.6mV | 1000mV |